United States Patent [19]
Smeenge, Jr. et al.

[11] Patent Number: 5,380,212
[45] Date of Patent: Jan. 10, 1995

[54] CONDUCTIVE ELASTOMERIC INTERFACE FOR A PIN GRID ARRAY

[75] Inventors: James G. Smeenge, Jr., Campbell; Paul L. Rogers, San Jose, both of Calif.

[73] Assignee: Hewlett Packard Company, Palo Alto, Calif.

[21] Appl. No.: 70,002

[22] Filed: May 28, 1993

Related U.S. Application Data

[63] Continuation of Ser. No. 930,873, Aug. 14, 1992, abandoned.

[51] Int. Cl.⁶ ............................................. H01R 4/58
[52] U.S. Cl. ........................................ 439/86; 439/91
[58] Field of Search ................... 439/86, 87, 89, 90, 439/91, 247, 927

[56] References Cited

U.S. PATENT DOCUMENTS

| | | | |
|---|---|---|---|
| 3,278,890 | 10/1966 | Cooney | 439/86 |
| 4,770,641 | 9/1988 | Rowlette | 439/86 |
| 4,912,401 | 3/1990 | Nady et al. | |

FOREIGN PATENT DOCUMENTS

| | | |
|---|---|---|
| 9014750 | 11/1990 | WIPO . |
| 9105961 | 6/1992 | WIPO . |

OTHER PUBLICATIONS

Cefarelli et all., "Test Connector", Feb. 1977, pp. 3508–3509, IBM Tech. Disclosure Bulletin, vol. 19, No. 9.
Catalog for Contact Products, Inc., p. 25.
Catalog page from IDI, Interconnect Devices, Inc.
Data sheets on PCB connectors from Yokowo Co. Ltd.
Data sheets on Connector W Series from Fujipoly, Inc.
Data Sheet from EMI Shielding Engineering Handbook, available from Chomerics, a Grace Company.

*Primary Examiner*—David L. Pirlot
*Attorney, Agent, or Firm*—Howard R. Boyle; Roland I. Griffin

[57] ABSTRACT

An electrical interface connects a conductive pins to a printed circuit board. The electrical interface includes an elastomer holder having a plurality of holes. Elastomer conductors are placed in the plurality of holes within the elastomer holder. The elastomer holder is then attached to the printed circuit board so that each elastomer conductor comes into contact with a conductive pad on the printed circuit board. The conductive pins are placed in electrical contact with the elastomer conductors, for example, through a conductive socket. In the preferred embodiment the elastomer holder is composed of printed circuit board material. Before the elastomer holder is connected to the printed circuit board, the elastomer conductors are held in the holes in the elastomer holder using a throw-away retainer.

8 Claims, 5 Drawing Sheets

CONDUCTIVE ELASTOMERIC INTERFACE FOR A PIN GRID ARRAY

This application is a continuation of copending application Ser. No. 07/930,873, filed Aug. 14, 1992, now abandoned.

BACKGROUND

The present invention concerns a conductive elastomeric interface for a pin grid array.

Several methods in the prior art are available to connect a pin grid array to a printed circuit board. For example, spring connectors may be used. For example, a spring connector series of PCB connectors is available from Yokowo Co. Ltd. having a business address of No. 5-11, Takinogawa 7-Chome, Kita-ku Tokyo 114, Japan. Also, various spring contact probes are available from Everett/Charles Contact Products Inc., having a business address of 1064 Yosemite Drive, Milpitas, Calif. 95035. However, for many applications, these spring connectors can be too tall. In addition, it can be difficult to interface the spring connectors to metalized pads on printed circuit boards. Also, spring connectors are expensive and too inductive for many applications. Further, many of the spring connectors will not work on a pitch of less than 0.100 inches.

Elastomer sheets are also available for connections. See for example high density matrix connector available from Fujipoly, Inc. having a business address of 750 Walnut Ave. P.O. Box 1050, Cranford, N.J. 07016. However, for printed grid arrays of over 500 pins, such sheets may not provide a reliable contact. In addition, for printed grid arrays of over 500 pins, the force required to compress all the pins into the elastomer sheet may result in bowing in the printed circuit board.

A custom fuzz button interface also is available, for example from Cinch Connector Division of Labinal Components and Systems, Inc., having a business address of 1500 Morse Ave., Elk Grove Village, Ill. 60007. A machined phenolic material holds electrical contacts. The contacts are cylinders of bunched wire (fuzz buttons). However, pins within a pin grid array sometimes have solder tips which can snag the fuzz button wire upon extraction. Additionally, the fuzz button interfaces are expensive to manufacture and have an inductive signal path. Further, the available fuzz button interface requires a distance of 0.172 inches or greater between printed circuit boards.

SUMMARY OF THE INVENTION

In accordance with the preferred embodiment of the present invention, an electrical interface is presented. The electrical interface connects conductive pins to a printed circuit board. The electrical interface includes an elastomer holder having a plurality of holes. Elastomer conductors are placed in the plurality of holes within the elastomer holder. The elastomer holder is then attached to the printed circuit board so that each elastomer conductor comes into contact with a conductive pad on the printed circuit board. The conductive pins are placed in electrical contact with the elastomer conductors, for example, through a conductive socket. In the preferred embodiment the elastomer holder is composed of printed circuit board material. Before the elastomer holder is connected to the printed circuit board, the elastomer conductors are held in the holes in the elastomer holder using a throw-away retainer.

The conductive elastomer interface according to the preferred embodiment of the present invention provides for electrical contact between a pin grid array and a printed circuit board that allows a greater density of prior art spring connector pins. The interface requires less compression and provides greater reliability than do interfaces using elastomer sheets. The preferred embodiment of the present invention also provides for a less expensive and more reliable interface than is provided by a fuzz button interface.

DESCRIPTION OF THE PREFERRED EMBODIMENT

Figure 1:
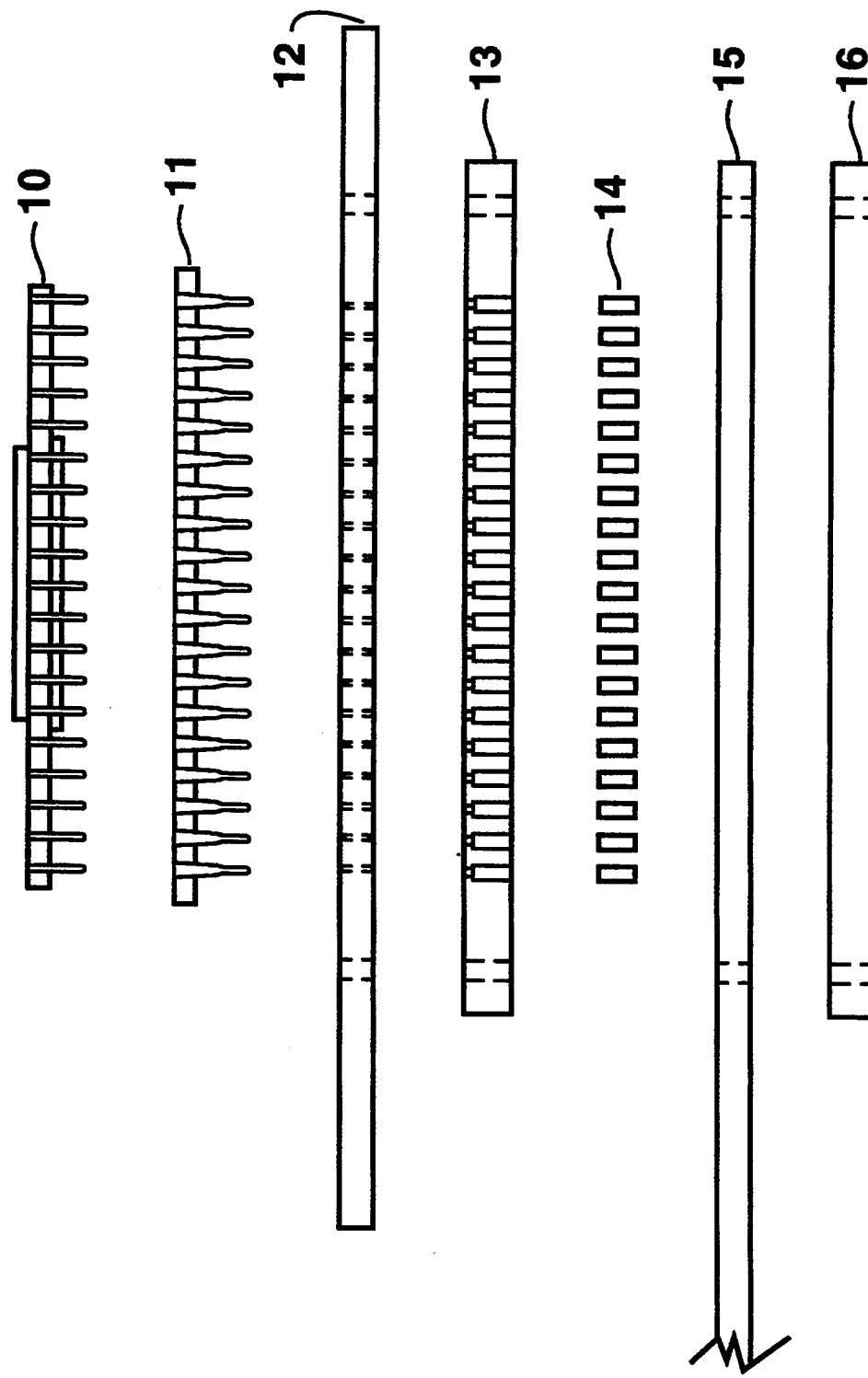
FIG. 1 shows elements of a conductive elastomeric interface for a pin grid array in accordance with the preferred embodiment of the present invention.

FIG. 1 shows elements of a conductive elastomeric interface used to connect a printed circuit board 15 to a pin grid array 10 in accordance with the preferred embodiment of the present invention. Pin grid array 10 has, for example, 504 pins. Each pin is, for example, 0.018 inches in diameter and has a length of 0.155 inches. The pins within pin grid array 10 are each placed with one of sockets 11. Sockets 11 are inserted within holes within printed grid array board 12. Each of the holes within printed grid array board 12 is, for example, 0.025 inches in diameter. The holes are plated through allowing connection of the pins to logic circuitry on printed grid array board 12. The pins are soldered to the plated through holes using an infrared oven. PGA board 12 is composed of FR4 printed circuit board material and has a thickness of approximately 0.076 inches.

Sockets 11 extend through pin grid board 12 to elastomer holder 13. Alternately, sockets 11 may be omitted and pin grid array may be directly connected to conductive elastomer cylinders held within elastomer holder 13. Elastomer holder 13 is composed of FR4 printed circuit board material and has a thickness of, for example, approximately 0.150 inches. Elastomer holder 13 includes holes into which conductive elastomer cylinders 14 are placed. Conductive elastomer cylinders 14 are for example composed of extruded conductive elastomer gaskets available from Chomerics, a Grace company, having a business address of 77 Dragon Court, Woburn, Mass. 01888. Each conductive elastomer cylinder has, for example, a length of 0.15 inches and a diameter of 0.04 inches.

Elastomer holder 13 is connected to a printed circuit board 15. Printed circuit board 15 has metalized pads which come into contact with conductive elastomer cylinders 14. Printed circuit board 15 is, for example, composed of FR4 printed circuit board material and is 0.095 inches thick.

A stiffener board 16 is attached to printed circuit board 15. Stiffener board 16 is, for example, composed of cold rolled steel and is 0.125 inches thick.

Figure 2:
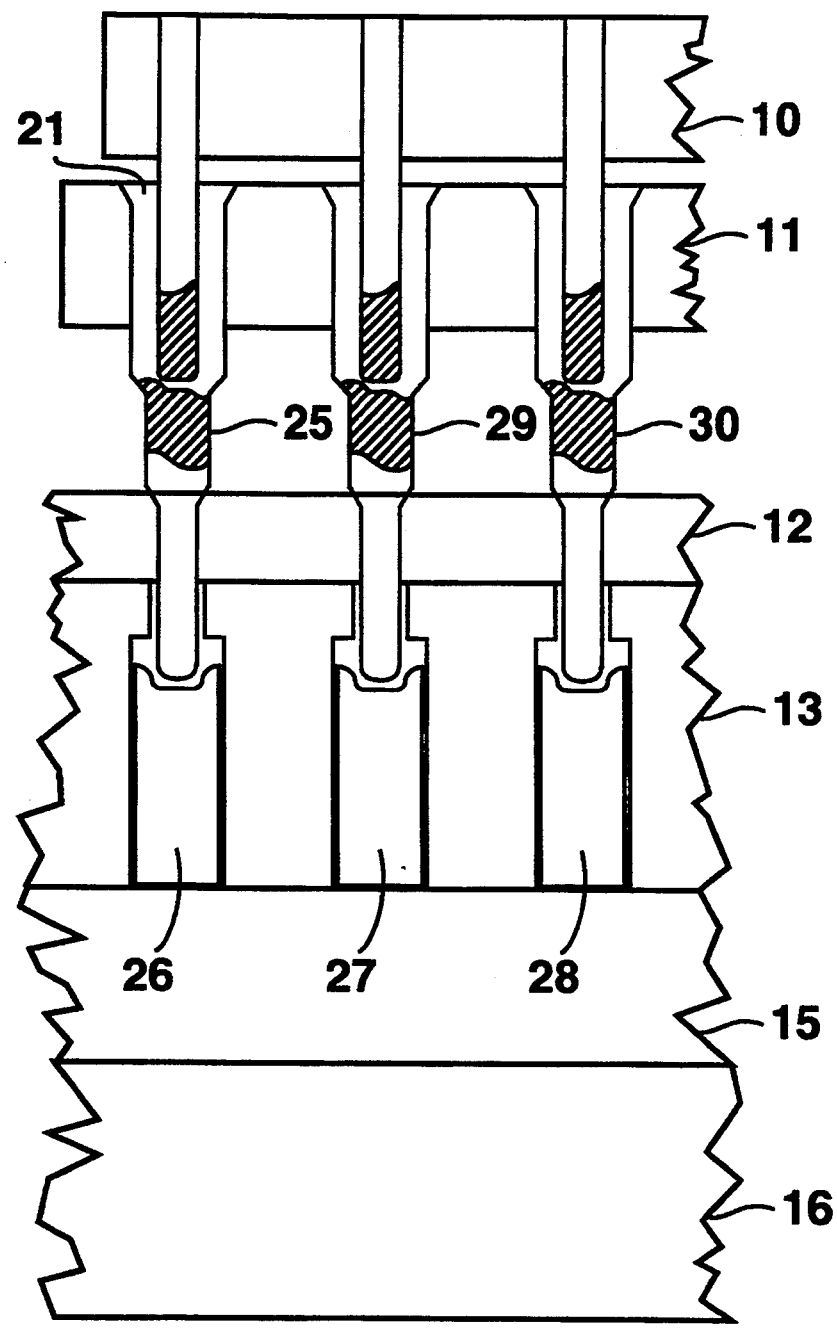
FIG. 2 shows a close-up view of a connected conductive elastomeric interface in accordance with the preferred embodiment of the present invention.

FIG. 2 shows a close-up view of the elements of the conductive elastomer interface shown in FIG. 1. For example, a socket 25, a socket 29 and a socket 30 are 20×20 PGA socket available from Mark Eyelet, Inc., Wolcot Conn. 06716, ordered using drawing number B-P1792. When connected, conductive elastomer cylinders 14 are compressed. For example in FIG. 2, a conductive elastomer cylinder 26, a conductive elastomer cylinder 27 and a conductive elastomer cylinder 28 are shown compressed by sockets 25, a socket 29 and a socket 30, respectively.

Figure 3:
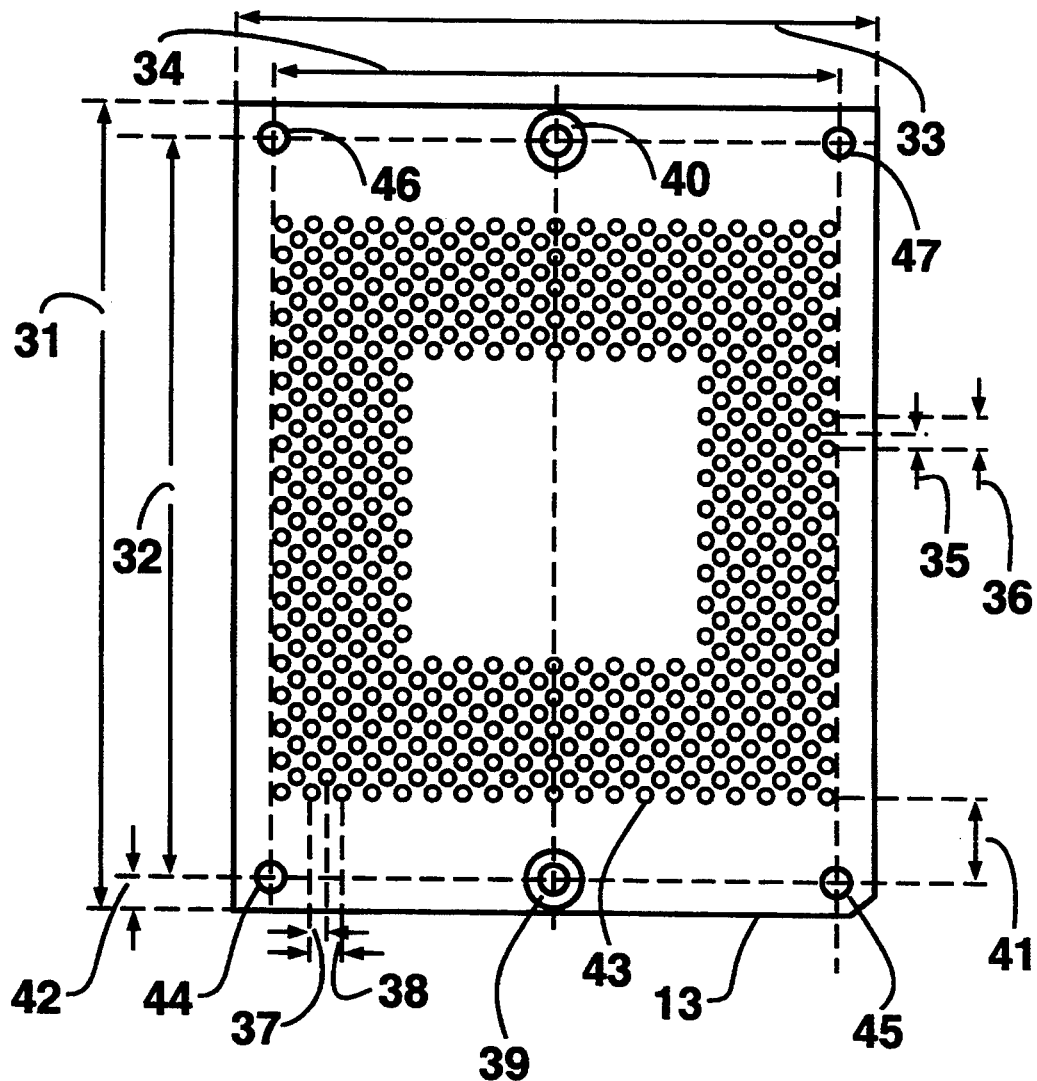
FIG. 3 shows a top view of an elastomer holder in accordance with the preferred embodiment of the present invention.

FIG. 3 shows a top view of elastomer holder 13. Elastomer holder 13 has a height 31 of 2.54 inches and a width 33 of 2.040 inches. A pattern of elastomer containing holes 43 are drilled with standard numerically controlled (NC) programmable drill processes. A distance 35 between elastomer containing holes is, for example, 0.050 inches. A distance 36 between elastomer containing holes is, for example, 0.100 inches. A distance 37 between elastomer containing holes is, for example, 0.050 inches. A distance 38 between elastomer containing holes is, for example, 0.100 inches. A screw hole 44, a screw hole 45, a screw hole 46 and a screw hole 47 are separated by a distance 34 of, for example, 1.83 inches and by a distance 32 of, for example, 2.30 inches. Hole 41 is separated from a bottom row of elastomer containing holes 43 by a vertical distance 41 of, for example 0.250 inches. Screws placed in a screw hole 39 and a screw hole 40 are used to connect elastomer holder 13 to printed circuit board 15. The connection results in conductive elastomer cylinders 14 into metalized pads on printed circuit board 15. This results in a good electrical contact between conductive elastomer cylinders 14 and the metalized pads.

Figure 4:
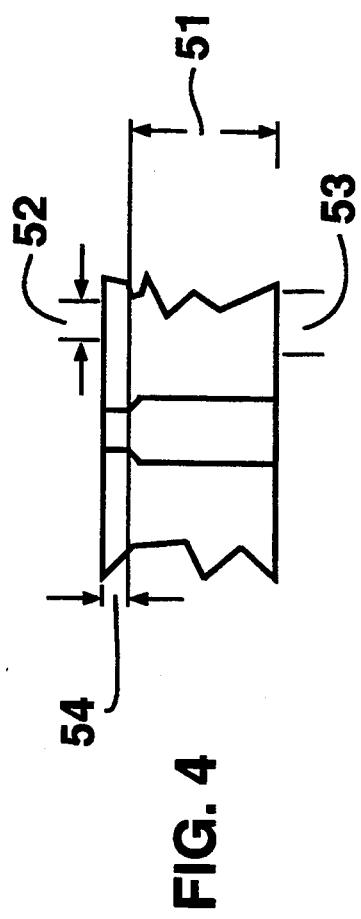
FIG. 4 shows a side view of a single elastomer container hole within the elastomer holder shown in FIG. 3 in accordance with the preferred embodiment of the present invention.

FIG. 4 shows a detail of an elastomer containing hole. A region 54 of each elastomer hole extends a distance of, for example 0.020 inches. Within region 54, the inner diameter 52 of the hole is, for example 0.030 inches. A region 51 of each elastomer hole extends a distance of, for example 0.130 inches. Within region 51, the inner diameter 53 of the hole is, for example 0.042 inches. When uncompressed, a conductive elastomer cylinder placed in the hole extends out the bottom of region 53 a distance of, for example 0.020 inches.

Figure 5:
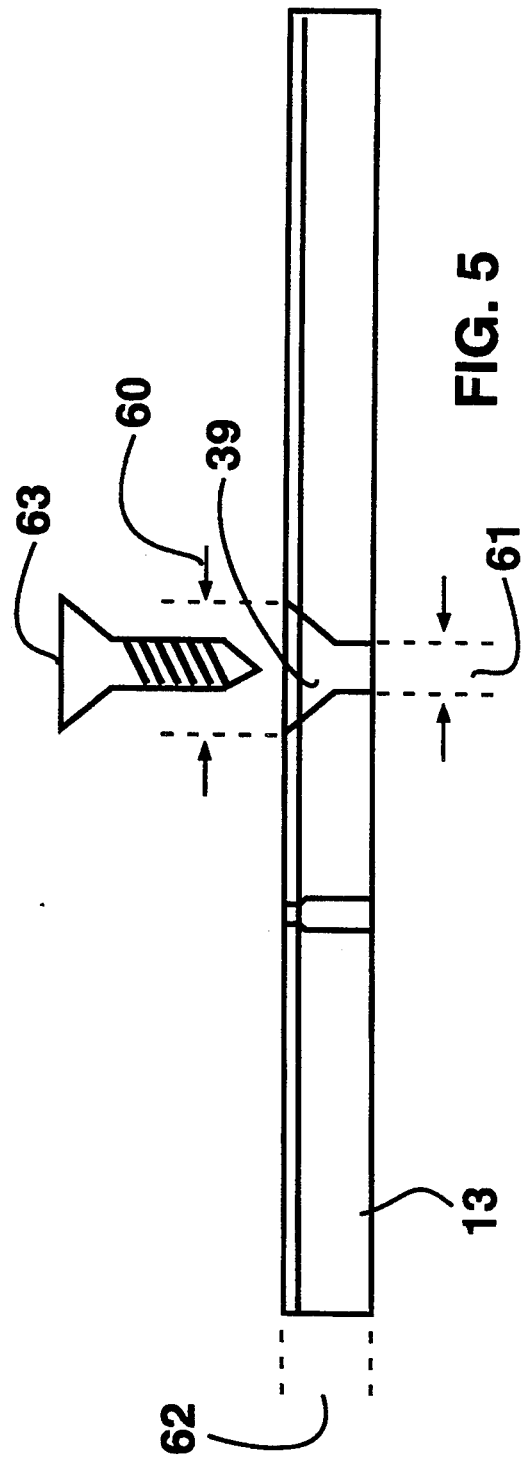
FIG. 5 shows a side view of a single screw hole within the elastomer holder shown in FIG. 3 in accordance with the preferred embodiment of the present invention.

FIG. 5 shows a cross section view of elastomer holder 13 which shows detail of screw hole 39. Screw hole 39 has a top diameter 60 of, for example, 0.020 inches and a bottom diameter 61 of, for example, 0.083 inches. Elastomer holder 13 is shown to have a total thickness 62 of, for example, 0.150 inches. A screw 63 is used to fasten elastomer holder 13 to printed circuit board 15.

Figure 6:
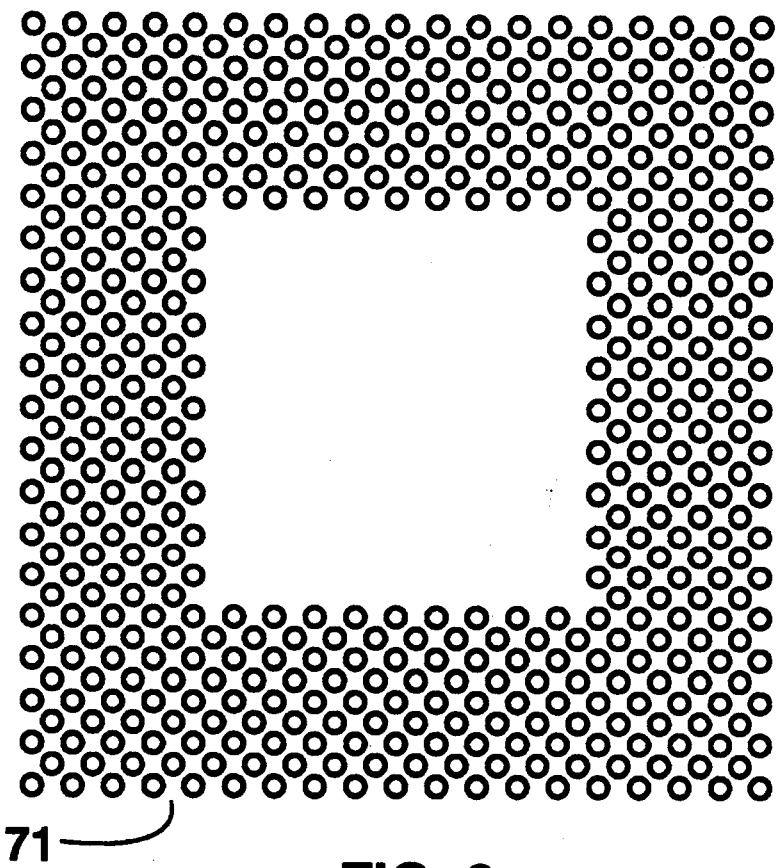
FIG. 6 shows a metalized pad pattern on a printed circuit board in accordance with the preferred embodiment of the present invention.

FIG. 6 shows a pattern 71 of metalized pads. For example, each pad is approximately 0.043 inches in diameter.

Figure 7:
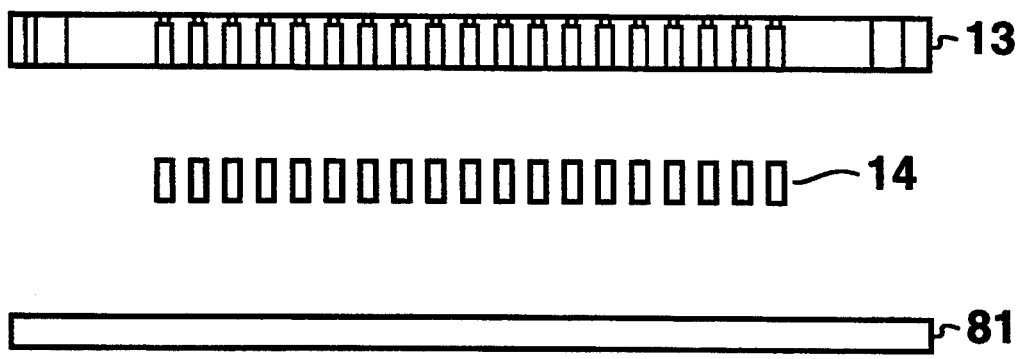
FIG. 7 shows an elastomeric interface with a throwaway container in accordance with a preferred embodiment of the present invention.

FIG. 7 shows a throw-away retainer 81 which is used to hold conductive elastomer cylinders 14 within elastomer holder 13 until elastomer holder 13 is attached to a printed circuit board. Throw-away retainer 81 may be, for example composed of a transparent polycarbonate material.

The low manufacturing cost of the above-described embodiment of an elastomeric interface is due to the fact that the elastomeric interface may be constructed using standard printed circuit board processes and materials. These processes are much less expensive than, for example, NC drilling in a machine shop. Additionally, the conductive elastomer used as a conductor is less expensive than other conductors used, such as fuzz buttons or spring connectors.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. An electrical interface for connection of conductive pins to a printed circuit board, the electrical interface comprising:

an elastomer holder having a plurality of holes, each hole having a first opening at a first side of the elastomer holder and having a second opening at a second side of the elastomer holder, the first opening being larger than the second opening;

elastomer conductors placed in the plurality of holes within the elastomer holder, the elastomer conductors being placed in the first openings of holes on the first side of the elastomer holder and the elastomer conductors being sufficient in size so that the elastomer conductors do not extend through the second openings and do extend out of the first openings; and, fastening means for fastening the elastomer holder to the printed circuit board so that the elastomer conductors extending out of the first holes on the first side of the elastomer holder come into contact with conductive pads on the printed circuit board;

wherein the conductive pins are placed through the second openings of the holes to bring them into electrical contact with the elastomer conductors.

2. An electrical interface as in claim 1 wherein the conductive pins are placed in electrical contact with the elastomer conductors through conductive sockets.

3. An electrical interface as in claim 1 wherein the elastomer holder is composed of printed circuit board material.

4. An electrical interface as in claim 1 wherein the elastomer conductors are cylinder shaped.

5. A method for providing an electrical interface between conductive pads on a printed circuit board and conductive pins, the method comprising the steps of:

(a) placing a plurality of elastomer conductors within holes in an elastomer holder, each hole having a first opening at a first side of the elastomer holder and having a second opening at a second side of the elastomer holder, the first opening being larger than the second opening, the elastomer conductors being placed in the first openings of holes on the first side of the elastomer holder and the elastomer conductors being sufficient in size do that the elastomer conductors do not extend through the second openings and do extend out of the first openings;

(b) connecting the elastomer holder to the printed circuit board so that the elastomer conductors extending out of the first holes on the first side of the elastomer holder are compressed against the conductive pads; and, (c) placing the conductive pins through the second openings of the holes to bring them into electrical contact with the elastomer conductors.

6. A method as in claim 5 wherein in step (c) the conductive pins are placed in electrical contact with the elastomer conductors through conductive sockets.

7. A method for providing an electrical interface between conductive pads on a printed circuit board and conductive pins, the method comprising the steps off:

(a) placing a plurality of elastomer conductors within holes in an elastomer holder;

(b) holding the elastomer conductors in the holes in the elastomer holder using a throw-away retainer;

(c) connecting the elastomer holder to the printed circuit board so that the elastomer conductors are compressed against the conductive pads; and, (d) placing the conductive pins in electrical contact with the elastomer conductors.

8. A method as in claim 7 wherein in step (d) the conductive pins are placed in electrical contact with the elastomer conductors through a conductive socket.

* * * * *

UNITED STATES PATENT AND TRADEMARK OFFICE
CERTIFICATE OF CORRECTION

PATENT NO. : 5,380,212
DATED : January 10, 1995
INVENTOR(S) : Smeenge, Jr. et al.

It is certified that error appears in the above-identified patent and that said Letters Patent is hereby corrected as shown below:

Column 1,
Line 29, after "example" insert -- the --

Column 4,
Line 67, after "size" delete "do" and insert therefor -- so --

Column 6,
Line 3, after "steps" delete "off:" and insert therefor -- of: --

Signed and Sealed this

Twenty-second Day of July, 2003

JAMES E. ROGAN
*Director of the United States Patent and Trademark Office*